United States Patent
Hori et al.

(10) Patent No.: US 12,237,824 B2
(45) Date of Patent: Feb. 25, 2025

(54) COMPOSITE SUBSTRATE, ELASTIC WAVE ELEMENT, AND PRODUCTION METHOD FOR COMPOSITE SUBSTRATE

(71) Applicant: NGK INSULATORS, LTD., Nagoya (JP)

(72) Inventors: Yuji Hori, Owariasahi (JP); Takahiro Yamadera, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 439 days.

(21) Appl. No.: 17/545,507

(22) Filed: Dec. 8, 2021

(65) Prior Publication Data
US 2022/0103155 A1 Mar. 31, 2022

Related U.S. Application Data

(63) Continuation of application No. PCT/JP2020/006285, filed on Feb. 18, 2020.

(30) Foreign Application Priority Data

Jun. 11, 2019 (JP) .................. 2019-108407

(51) Int. Cl.
*H03H 9/02* (2006.01)
*H03H 3/10* (2006.01)
*H10N 30/072* (2023.01)

(52) U.S. Cl.
CPC .......... *H03H 9/02574* (2013.01); *H03H 3/10* (2013.01); *H03H 9/02559* (2013.01); *H03H 9/02834* (2013.01); *H10N 30/072* (2023.02)

(58) Field of Classification Search
CPC .......... H03H 9/02574; H03H 9/02559; H03H 9/02834; H03H 3/10; H01N 30/072
See application file for complete search history.

(56) References Cited

U.S. PATENT DOCUMENTS

| 6,270,202 B1 * | 8/2001 | Namba | ................. B41J 2/1626 347/68 |
| 10,084,427 B2 | 9/2018 | Solal et al. | |

(Continued)

FOREIGN PATENT DOCUMENTS

| JP | 2004-343359 A | 12/2004 |
| JP | 2005-252550 A | 9/2005 |

(Continued)

OTHER PUBLICATIONS

Shogo Inoue et al., Spurious Free SAW Resonators on Layered Substrate with Ultra-High Q, High Coupling and Small TCF, IEEE International Ultrasonic Symposium 2018 Proceedings (4 pages).

(Continued)

*Primary Examiner* — Forrest M Phillips
(74) *Attorney, Agent, or Firm* — FLYNN THIEL, P.C.

(57) ABSTRACT

A composite substrate includes a supporting substrate composed of quartz, a piezoelectric material substrate composed of a material selected from the group consisting of lithium niobate, lithium tantalate and lithium niobate-lithium tantalate; and an interface layer along a bonding interface between the supporting substrate and the piezoelectric material substrate. The interface layer has amorphous structure and contains constituent components including silicon, oxygen and at least one of tantalum and niobium. The interface layer has concentrations of hydrogen atoms, nitrogen atoms and fluorine atoms of $1\times10^{18}$ atoms/cm$^3$ or higher and $5\times10^{21}$ atoms/cm$^3$ or lower, respectively.

5 Claims, 10 Drawing Sheets

(56) References Cited

U.S. PATENT DOCUMENTS

| | | | |
|---|---|---|---|
| 2004/0226162 A1 | 11/2004 | Miura et al. | |
| 2005/0194864 A1 | 9/2005 | Miura et al. | |
| 2014/0210317 A1 | 7/2014 | Tai et al. | |
| 2018/0048282 A1 | 2/2018 | Kurimoto et al. | |
| 2021/0006224 A1 | 1/2021 | Hori et al. | |

FOREIGN PATENT DOCUMENTS

| | | | | |
|---|---|---|---|---|
| JP | 2018-26695 A | 2/2018 | | |
| JP | 2018-207355 A | 12/2018 | | |
| JP | 6524369 B1 | 6/2019 | | |
| WO | 2014/077213 A1 | 5/2014 | | |
| WO | WO-2019039474 A1 * | 2/2019 | ........... | H01L 41/053 |
| WO | WO-2020250490 A1 * | 12/2020 | ............... | H03H 3/08 |

OTHER PUBLICATIONS

Michio Kadota et al., Suprious-Free, Near-Zero-TCF Hetero Acoustic Layer (HAL) SAW Resonators Using LiTaO3 Thin Plate on Quartz, IEEE International Ultrasonic Symposium 2018 Proceedings (4 pages).

Q.-Y. Tong and U. Gösele, Semiconductor Wafer Bonding: Science and Technology, The Electrochemical Society Series, Wiley-Inter Science, pp. 24-29 (11 pages).

International Search Report, with English translation, issued in corresponding International Application No. PCT/JP2020/006285, date of mailing Apr. 14, 2020 (8 pages).

Written Opinion of International Searching Authority issued in corresponding International Application No. PCT/JP2020/006285, date of mailing Apr. 14, 2020 (4 pages).

English Translation of the International Preliminary Report on Patentability, issued in corresponding International Application No. PCT/JP2020/006285 Date of Mailing Dec. 23, 2021 (6 pages).

* cited by examiner

Temperature of thermal treatment and bonding strength

● Inventive Examples

Concentration of hydrogen atoms

Solid line : Inventive Example 1

Concentration of fluorine atoms

Solid line : Inventive Example 1

Dotted line : Comparative Example 1

Concentration of Nitrogen atoms

Solid line : Inventive Example 1

Dotted line : comparative Example 1

Concentration of carbon atoms

Solid line : Inventive Example 1

Dotted line : Comparative Example 1

COMPOSITE SUBSTRATE, ELASTIC WAVE ELEMENT, AND PRODUCTION METHOD FOR COMPOSITE SUBSTRATE

CROSS-REFERENCE TO RELATED APPLICATIONS

This application is a continuation of PCT/JP2020/006285, filed Feb. 18, 2020, which claims priority to Japanese Application No. JP2019-108407 filed on Jun. 11, 2019, the entire contents of which are all incorporated hereby by reference.

TECHNICAL FIELD

The present invention is related to a composite substrate of a piezoelectric material substrate and supporting substrate, and a method of producing the same.

BACKGROUND ARTS

An SOI substrate composed of a high resistance Si, an $SiO_2$ thin film and an Si thin film, have been widely used for realizing a high-performance semiconductor element. Plasma activation is applied for realizing the SOI substrate. This is because bonding can be performed at a relatively low temperature (400° C.). A composite substrate composed of the similar Si, $SiO_2$ thin film and piezoelectric thin film, is proposed for improving the performance of a piezoelectric device.

Further, for improving the temperature characteristic and Q value of an SAW filter, an SAW filter having the structure of bonding a supporting substrate and piezoelectric material substrate has been reported. Specifically, a piezoelectric device applying a composite substrate, having the structure of bonding a quartz substrate and lithium tantalate substrate, which provides excellent performance, has been reported. (non-patent documents 1 and 2 and patent documents 1 and 2).

Non-Patent Documents (Non-patent document 1)
Shogo Inoue et. al. "Spurious Free SAW Resonators on Layered Substrate with Ultra-High Q, High Coupling and Small TCF", IEEE International Ultrasonic Symposium 2018 Proceedings (Non-patent document 2)
Michio Kadota et. al. "Suprious-Free, Near-Zero-TCF Hetero Acoustic Layer (HAL) SAW Resonators Using LiTaO3 Thin Plate on Quartz", IEEE International Ultrasonic Symposium 2018 Proceedings

Patent Documents (Patent document 1) U.S. Pat. No. 10,084,427 B2
(Patent document 2) Japanese Patent Publication No. 2018-026695A

SUMMARY OF THE INVENTION

For such a composite substrate, thinning of the piezoelectric material substrate is a requirement of design. However, as the thickness of the piezoelectric material substrate is generally smaller, a strong bonding strength is necessary. For example, although a bonded body of quartz and piezoelectric layer is proposed in patent document 2, in the case where the piezoelectric material substrate is thinned, there is a problem of separation from the supporting substrate. Further improvement of the bonding strength is demanded.

An object of the present invention is, in bonding a supporting substrate made of quartz and a piezoelectric material substrate composed of a material selected from the group consisting of lithium niobate, lithium tantalate and lithium niobate-lithium tantalate, to improve the bonding strength and to prevent the separation even in the case where the piezoelectric material substrate is thinned.

As aspect of the present invention provides a composite substrate comprising:
  a supporting substrate comprising quartz;
  a piezoelectric material substrate comprising a material selected from the group consisting of lithium niobate, lithium tantalate and lithium niobate-lithium tantalate; and
  an interface layer at an interface between the supporting substrate and the piezoelectric material substrate, the interface layer having amorphous structure and comprising constituent components including silicon, oxygen, and at least one of tantalum and niobium,
  wherein the interface layer has concentrations of hydrogen atoms, nitrogen atoms and fluorine atoms of $1\times10^{18}$ $atoms/cm^3$ or higher and $5\times10^{21}$ $atoms/cm^3$ or lower, respectively.

Another aspect of the present invention provides an acoustic wave device comprising:
  the composite substrate; and
  an electrode on said piezoelectric material substrate.

Yet another aspect of the present invention provides a method of producing a composite substrate comprising a supporting substrate comprising quartz and a piezoelectric material substrate comprising a material selected from the group consisting of lithium niobate, lithium tantalate and lithium niobate-lithium tantalate, said method comprising the steps of;
  irradiating a plasma containing nitrogen gas onto a surface of the supporting substrate to generate an activated surface;
  irradiating a plasma containing nitrogen gas onto a surface of the piezoelectric material substrate to generate an activated surface;
  contacting the activated surface of the supporting substrate and the activated surface of the piezoelectric material substrate to obtain a bonded body;
  thinning the piezoelectric material substrate by processing to a thickness of 20 µm or smaller; and
  subjecting the bonded body to a thermal treatment at a temperature of 250° C. or higher and 350° C. or lower.

For the case where a piezoelectric material substrate composed of lithium tantalate or the like and a supporting substrate composed of quartz are directly bonded with each other, the inventors tried the method of subjecting the surfaces of the piezoelectric material substrate and supporting substrate by plasma irradiation, respectively, the respective activated surfaces being contacted and bonded with each other and then subjected to thermal treatment. During the trial, it was found that the bonding strength can be considerably improved to suppress the separation of the piezoelectric material substrate from the supporting substrate when the piezoelectric material substrate is thinned by the processing, by performing thermal treatment at a temperature of 250° C. or higher and 350° C. or lower.

The inventors have further studied the reason that the bonding strength is improved, and obtained the following findings. That is, it was found that a fine interface layer is generated along an interface between the piezoelectric material substrate composed of lithium tantalate or the like and supporting substrate composed of quartz in the composite substrate having the improved bonding strength, and that the concentrations of hydrogen atoms, nitrogen atoms and fluorine atoms in the interface layer are high, specifically at a value of $1 \times 10^{18}$ atoms/cm$^3$ or higher to form peaks. The invention was thus made.

Although the reason that such effects are obtained is not clear, it seems that the bonding strength is improved in the case where nitrogen and minute quantities of water content and fluorine in the atmosphere are attached at the bonding interface during the plasma irradiation and are concentrated in the vicinity of the interface and distributed in the interface layer in large quantities during the thermal treatment. In the case where the temperature of the thermal treatment is low, it is thought that the concentration of nitrogen, hydrogen and fluorine in the interface layer is rather suppressed and that the improvement of the bonding strength is rather suppressed in such case.

Further, according to the description of patent document 2, the supporting substrate composed of quartz and piezoelectric material substrate composed of lithium tantalate are bonded, it is preferred to form an amorphous silicon oxide layer or amorphous alumina layer on the surface of the supporting substrate or surface of the piezoelectric material substrate before the bonding followed by thermal treatment at 150 to 200° C. On the other hand, according to a method of the present invention, the surfaces of the supporting substrate composed of quartz and piezoelectric material substrate composed of lithium tantalate or the like are subjected to surface activation by nitrogen gas-containing plasma and direct bonding, followed by thermal treatment at 250° C. or higher. A fine interface layer is generated at this time, and relatively high atomic concentrations of hydrogen, nitrogen and fluorine atoms are present in the interface layer.

MODES FOR CARRYING OUT THE INVENTION

An example of the present invention will be described in detail below, appropriately referring to the attached drawings.

Figure 1A:
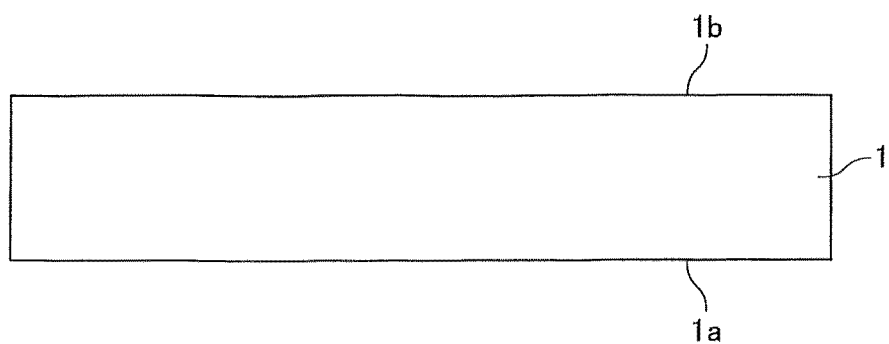
FIG. 1 (a) shows a piezoelectric material substrate, and FIG. 1 (b) shows the state that a bonding surface 1a of the piezoelectric material substrate is activated to generate an activated surface.
Figure 1B:
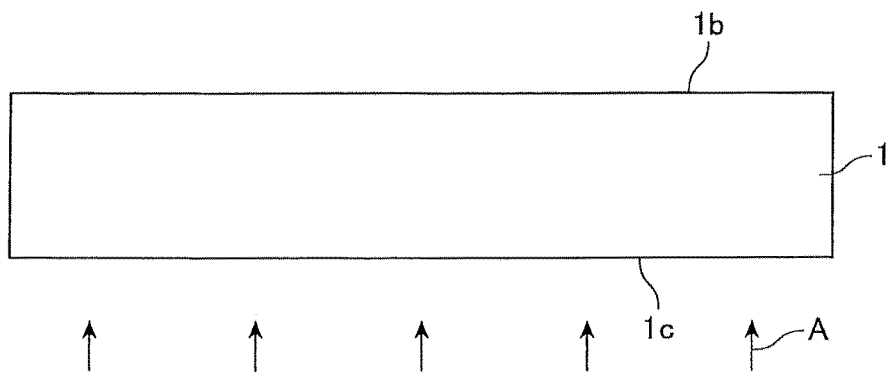

First, as shown in FIG. 1 (a), a piezoelectric material substrate 1 having a pair of main surfaces 1a and 1b is prepared. According to the present example, 1a is selected as a bonding surface. Then, as shown in FIG. 1 (b), plasma is irradiated onto the bonding surface 1a of the piezoelectric material substrate 1, shown as arrow A, to obtain an activated bonding surface 1c.

Figure 2A:
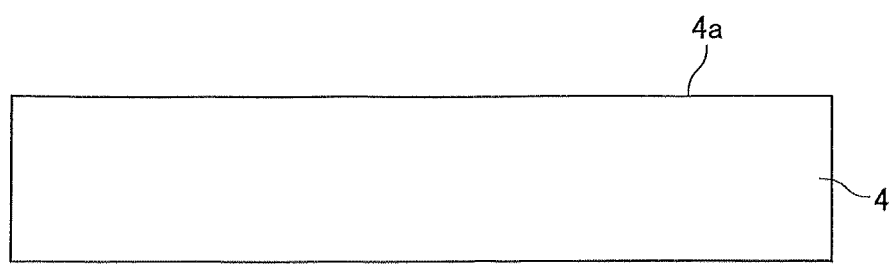
FIG. 2 (a) shows a supporting substrate, and FIG. 2 (b) shows the state that a surface of the supporting substrate is activated.
Figure 2B:
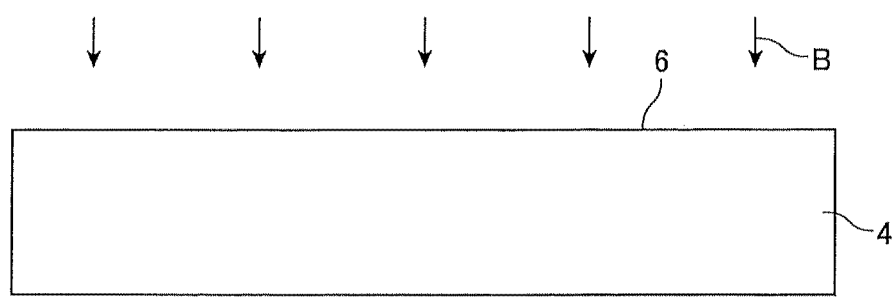

On the other hand, as shown in FIG. 2 (a), a supporting substrate 4 is prepared. Then, as shown in FIG. 2 (b), plasma is irradiated onto the surface 4a of the supporting substrate 4, shown as arrow B, for performing the surface activation, to form an activated bonding surface 6.

Figure 3A:
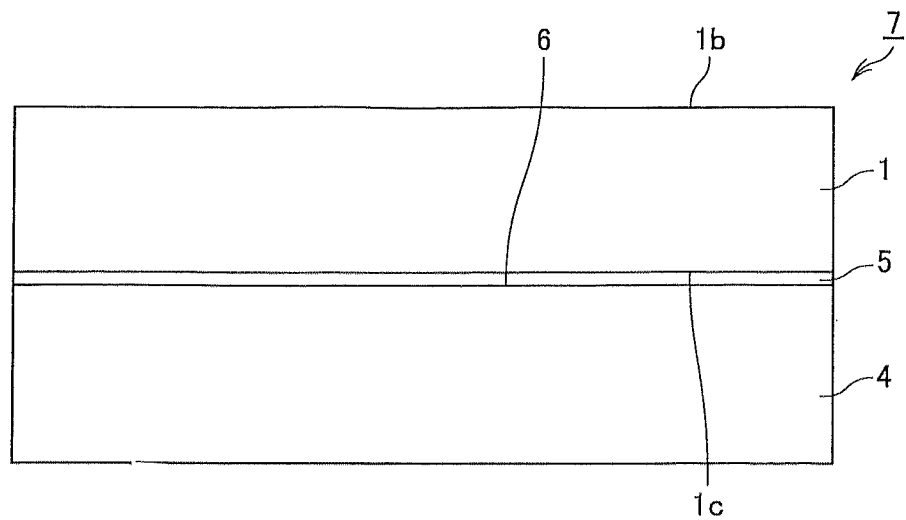
FIG. 3 (a) shows a bonded body obtained by directly bonding the piezoelectric material substrate and supporting substrate, FIG. 3 (b) shows the state that a piezoelectric material substrate of the bonded body is thinned by polishing, and FIG. 3 (c) shows an acoustic wave device.
Figure 3B:
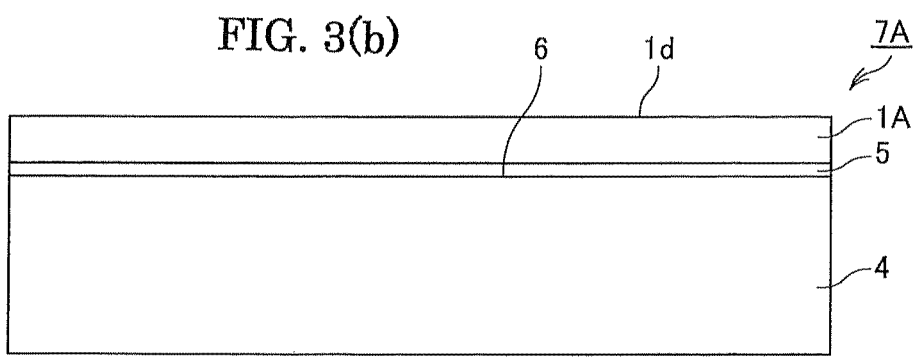
Figure 3C:
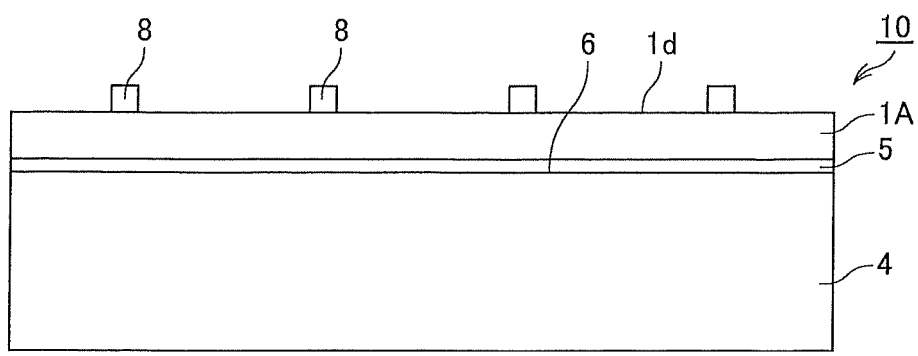

Then, as shown in FIG. 3 (a), the activated bonding surface 1c of the piezoelectric material substrate 1 and activated bonding surface 6 of the supporting substrate 4 are contacted and directly bonded with each other, to obtain a bonded body. The thus obtained bonded body is heated to obtain a bonding strength which can endure the grinding process. During the heating step, the heating temperature may be 50 to 150° C., and more preferably 80 to 120° C.

The piezoelectric substrate of the bonded body is then thinned by processing with a grinding machine. The bonded body is then subjected to thermal treatment at a temperature of 250° C. or higher to obtain a bonded body 7. Here, an interface layer 5 containing silicon, oxygen and one or both of tantalum and niobium as main components is generated. At this stage, an electrode may be provided on the piezoelectric material substrate 1. However, preferably, as shown in FIG. 3 (b), the main surface 1b of the piezoelectric material substrate 1 is processed to thin the substrate 1, to obtain a thinned piezoelectric material substrate 1A. 1d represents a processed surface. Then, as shown in FIG. 3 (c), predetermined electrodes 8 are formed on the processed surface 1d of the piezoelectric material substrate 1A of a bonded body 7A to obtain an acoustic wave device 10.

The respective constituents of the present invention will be described in the order below.

The material of the supporting substrate is of quartz. Quartz is a crystal having anisotropy, and the performance of a piezoelectric device is dependent on the crystal orientation. According to the non-patent document 1, spurious is suppressed by noting the acoustic velocity. It is thus possible to appropriately select the orientation so that desired performance can be obtained.

The piezoelectric material substrate 1 used in the present invention is composed of lithium tantalate (LT), lithium niobate (LN), or lithium niobate-lithium tantalate solid solution. As the materials have high propagation speeds of an acoustic wave and large electromechanical coupling factors, they are suitable for a surface acoustic wave device of a high frequency and wide-band frequency application.

Further, although the normal line direction of the main surfaces 1a and 1b of the piezoelectric material substrate 1 is not particularly limited, for example, in the case where the piezoelectric material substrate 1 is made of LT, it is preferred to use the substrate rotated from Y-axis toward Z-axis by 32 to 55° ((180°, 58 to 35°, 180° on Euler angle representation) around X-axis, which is a direction of propagation of a surface acoustic wave, because of a low propagation loss. In the case where the piezoelectric material substrate 1 is made of LN, (i) it is preferred to use the substrate rotated from Z axis toward-Y-axis by 37.8° ((0°, 37.8°) 0° on Euler angle representation) around X-axis, which is the direction of propagation of the surface acoustic wave, because of a larger electromechanical coupling factor. Alternatively, (ii) it is preferred to use the substrate rotated from Y axis toward Z axis by 40 to 65° ((180°, 50 to 25°, 180°) on Euler angle representation) around X-axis, which is the direction of propagation of the surface acoustic wave, because of a high acoustic velocity. Further, although the size of the piezoelectric material substrate 1 is not particularly limited, for example, the diameter may be 100 to 200 mm and thickness may be 0.15 to 1 µm.

Plasma is then irradiated onto the surface of the piezoelectric material substrate and surface of the supporting substrate to activate the respective surfaces.

The atmosphere during the surface activation is atmosphere containing nitrogen gas. The atmosphere may be composed of nitrogen gas or oxygen gas alone, or may be mixed gases of nitrogen gas and oxygen gas, hydrogen gas or argon.

The pressure of the atmosphere during the surface activation is preferably 100 Pa or lower and more preferably 80 Pa or lower. Further, the pressure of the atmosphere is preferably 30 Pa or higher and more preferably 50 Pa or higher.

The temperature during plasma irradiation is 150° C. or lower. It is thus possible to obtain a bonded body 7 having a high bonding strength and without deterioration of piezoelectric material. From that viewpoint, the temperature during the plasma irradiation is made 150° C. or lower, and is preferably 100° C. or lower.

Further, the energy of the plasma irradiation is preferably 30 to 150 W. Further, the product of the energy and irradiation time duration of the irradiated plasma is preferably 0.1 to 3.0 Wh.

According to a preferred embodiment, before the surface activation treatment, the bonding surface 1a of the piezoelectric material substrate and of surface 4a of the supporting substrate are subjected to a flattening process. The method of flattening the respective surfaces 1a and 4a may be lapping, chemical mechanical polishing (CMP) and the like. Further, the flattened surfaces preferably have an Ra of 1 nm or lower and more preferably 0.3 nm or lower.

Then, the activated surface of the piezoelectric material substrate and the activated surface of the supporting substrate are contacted and bonded with each other. Thereafter, the bonded body is subjected to thermal treatment (annealing treatment) to improve the bonding strength. The temperature during the thermal treatment is 250° C. or higher and is more preferably 270° C. or higher. Further, the temperature during the thermal treatment is preferably 350° C. or lower and more preferably 300° C. or lower.

According to the present invention, the concentrations of hydrogen atoms, nitrogen atoms and fluorine atoms at the respective parts (particularly in the interface layer) of the bonded body are $1\times10^{18}$ atoms/cm$^3$ or higher, are preferably $1\times10^{19}$ atoms/cm$^3$ or higher, more preferably $5\times10^{19}$ atoms/cm$^3$ or higher and most preferably $1\times10^{20}$ atoms/cm$^3$ or higher. Further, the atomic concentrations in the interface layer are preferably $5\times10^{21}$ atoms/cm$^3$ or lower and more preferably $3\times10^{21}$ atoms/cm$^3$ or lower, from the viewpoint of actual production.

The concentrations of hydrogen, fluorine, nitrogen and carbon are measured by means of SIMS method (Secondary ion mass spectrometry). "CAMECA IMS-7f" was used as the SIMS measuring system, Cs$^+$ was used as the primary ion specie, the primary acceleration voltage was 15.0 kV, and the detection area was a circle with 30 µmφ.

The thickness of the interface layer is preferably 3 to 20 nm and more preferably 5 to 15 nm, from the viewpoint of the present invention. Further, the presence and thickness of the interface layer can be confirmed by observing the cross section of the composite substrate by means of a high-resolution transmission type electron microscope (magnification of 8,000,000 folds).

It was observed that the interface layer is of amorphous state based on the comparison of it with the single crystal substrates on the upper and lower sides. As the interface layer is generated by the diffusion (migration) from the composition of the piezoelectric material substrate and composition of the supporting substrate, the interface layer contains constituent components including silicon, oxygen and one or both of tantalum and niobium forming the piezoelectric material substrate. Preferably, the interface layer is essentially consisting of silicon, oxygen and one or both of tantalum and niobium forming the piezoelectric material substrate. However, even in this case, impurities such as hydrogen atoms, fluorine atoms, nitrogen atoms and other minute quantities of impurities may be contained.

According to the present invention, when the piezoelectric material substrate is thinned by processing, it is possible to suppress the separation of the piezoelectric material substrate from the supporting substrate. Thus, from the viewpoint of performance of the composite substrate, particularly acoustic wave device, the thickness of the piezoelectric material substrate is preferably 2, 0 µm or smaller and more preferably 1.0 µm or smaller. Although the lower limit of the thickness of the piezoelectric material substrate is not particularly limited, the thickness may be 0.05 µm or larger, from the viewpoint of the actual processing. Further, the thickness of the piezoelectric material substrate is measured by means of an optical type measuring machine (supplied by Filmetrix corporation) applying optical interference.

The bonded bodies 7 and 7A can be appropriately used for the acoustic wave device 10.

As the acoustic wave device 10, a surface acoustic wave device, Lamb wave-type device, thin film resonator (FBAR) and the like are known. For example, a surface acoustic wave device is produced by providing input side IDT (Interdigital transducer) electrodes (also referred to as comb electrodes or interdigitated electrodes) for an oscillating surface acoustic wave, and IDT electrodes on the output side for receiving the surface acoustic wave on the surface of the piezoelectric single crystal substrate. By applying high frequency signal on the IDT electrodes on the input side, an electric field is generated between the electrodes, so that the surface acoustic wave is oscillated and propagated on the piezoelectric substrate. Then, the propagated surface acoustic wave is drawn as an electrical signal from the IDT electrodes on the output side provided in the direction of the propagation.

The material forming the electrodes (electrode pattern) 8 on the piezoelectric material substrate 1A is preferably aluminum, aluminum alloy, copper or gold and more preferably aluminum or aluminum alloy. The aluminum alloy used is preferably Al doped with 0.3 to 5 weight percent of Cu. In this case, Ti, Mg, Ni, Mo, or Ta may be used instead of Cu.

EXAMPLES

Inventive Example 1

A surface acoustic wave device, according to the procedure described referring to FIGS. 1 to 3, was produced.

Specifically, a 42Y-cut X-propagation LiTaO$_3$ substrate (piezoelectric material substrate) 1 having a thickness of 250 μm with both surfaces mirror polished and an AT-cut quartz substrate (supporting substrate) 4 having a thickness of 350 μm were prepared. The sizes of the substrates were 100 mm, respectively. Then, the surface 1a of the piezoelectric material substrate 1 and surface 4a of the supporting substrate 4 were subjected to cleaning and surface activation, respectively.

Specifically, ultrasonic cleaning by pure water was performed and the surfaces of the substrates were dried by spin drying. Then, the supporting substrate after the cleaning was introduced into a plasma activation chamber and the substrate surface was activated by nitrogen gas plasma at 30° C. Further, the piezoelectric material substrate was similarly introduced into the plasma activation chamber and the substrate surface was subjected to surface activation by nitrogen gas plasma at 30° C. Each time duration of the surface activation was 40 seconds, and each energy level was 100 W. For removing particles attached during the surface activation, the ultrasonic cleaning and spin drying as described above were performed again.

Figure 4:
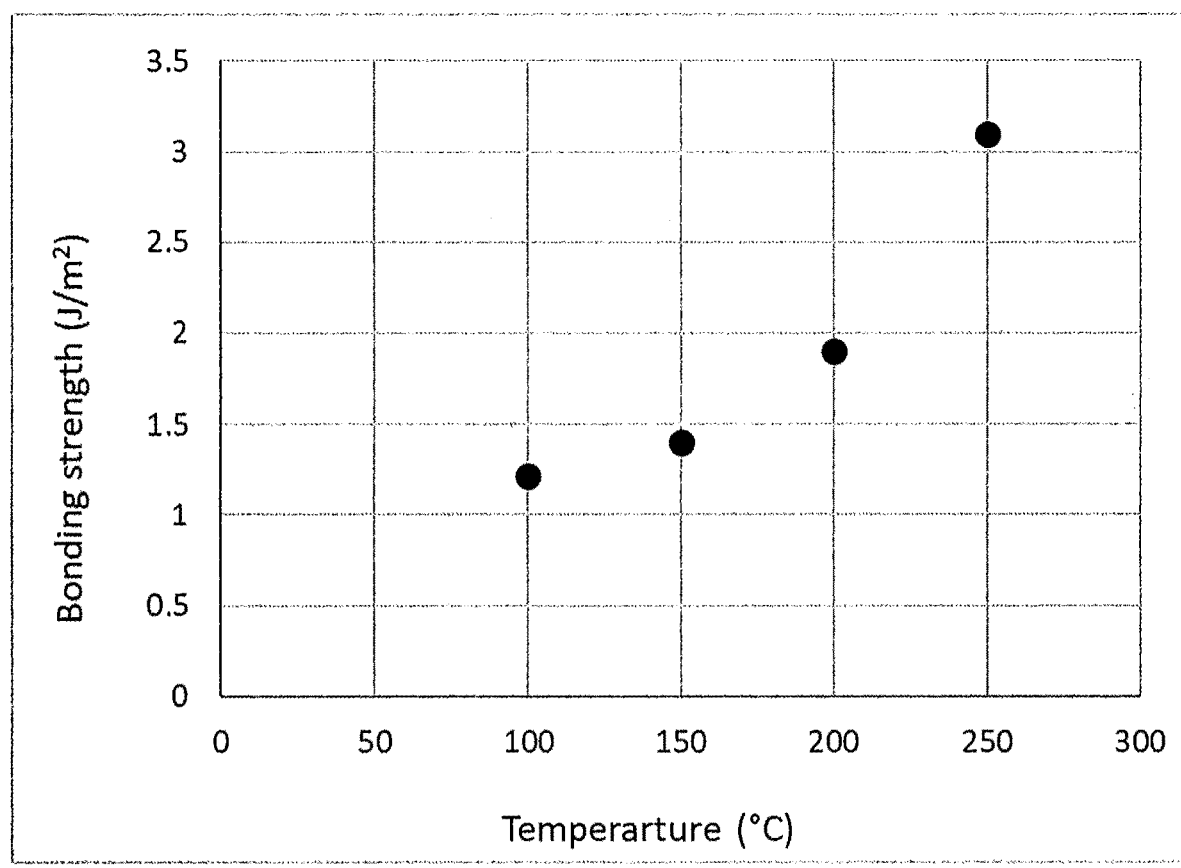
FIG. 4 is a graph showing an example of the relationship between the heating temperature and bonding strength after the direct bonding.

The positions of the supporting substrate and piezoelectric material substrate were then adjusted so that the activated bonding surfaces of the respective substrates were contacted with each other at room temperature. As the central parts of the interposed substrates were pressurized, the state (so-called bonding wave) that the adhesion of the piezoelectric material substrate and supporting substrate was spreading was observed to prove that good preliminary bonding was accomplished. Then, for improving the bonding strength, the bonded body was charged into an oven filled with nitrogen atmosphere for over 10 hours. As the relationship between the thermal treatment temperature and bonding strength was researched, the data shown in FIG. 4 was obtained. Non-patent documents 1 and 2 and patent document 1 describe that it is necessary to make the thickness of the piezoelectric material very thin for realizing an SAW filter having high performance obtained by the piezoelectric material and quartz. Very strong bonding is necessary for realizing such structure by CMP.

Specifically, a bonding strength of 3 J/m$^2$ or larger is necessary. According to the structure of the present invention, a thermal treatment temperature of 250° C. or higher is necessary. Further, the bonding strength was evaluated by blade method described in the following document.

"SEMICONDUCTOR WAFER BONDING" Q. Y. Tong, U. Gösele, Wiley-Inter Science. P. 27

The piezoelectric material substrate of the composite substrate after the thermal treatment at 100° C. was processed by a grinding machine to a thickness of 10 μm. The processed substrate was heated at 250° C. for 10 hours more. Then, the composite substrate was set in a lapping machine and processed until the thickness of the piezoelectric material substrate reached 5 μm, while diamond slurry was supplied. Finally, it was polished by a CMP processing machine for performing the removal of a processing denatured layer and final adjustment of the thickness. Colloidal silica was supplied as slurry for polishing. As the composite substrate was taken out after the polishing, the separation of the piezoelectric material substrate from the supporting substrate was not observed, confirming that very strong bonding was realized. As the thickness of the piezoelectric material substrate was measured by the optical type measuring system (supplied by Filmetrix corporation, "F20") by optical interference, a very thin layer of 2.0 μm was obtained.

As the CMP was continued, separation was not observed even when the thickness of the piezoelectric material substrate reached 0.3 μm.

Inventive Example 2

Plasma of mixed gases of 80 percent of nitrogen gas and 20 percent of oxygen gas was applied instead of nitrogen gas plasma as for Inventive Example 1. When the gas composition was changed, the matching was appropriately changed so that the reflective electric power of RF takes the minimum. The other procedure was the same as that of the processing of the composite substrate for Inventive Example 1. Further in this case, similar to Inventive Example 1, a large bonding strength of 3.2 J J/m$^2$ was measured after the heating at 250° C. Further, even in the case where the thickness of the piezoelectric layer was made 1 μm by the CMP processing in the thus obtained composite substrate, separation from the supporting substrate was not observed. The results are shown in Table 1.

Comparative Example 1

A high-speed neutralized argon beam was used to perform the activation of the respective surfaces of the piezoelectric material substrate and supporting substrate instead of the nitrogen plasma as for Inventive Example 1. The acceleration voltage was 1 kV, Ar flow rate was 27 sccm and surface activation time duration was 120 seconds at this stage. The piezoelectric material substrate and supporting substrate were contacted and bonded with each other at a pressure of 10 kN in a vacuum chamber in the bonding machine described above. The thus drawn bonded body was charged into the oven at 100° C. as in Inventive Example 1 and the composite substrate was taken out 10 hours after. As grinding the thus obtained composite substrate was attempted by means of a grinding machine so that the thickness of the piezoelectric material substrate reached 10 μm, the grinding machine was changed to error mode when it was processed in a thickness of about 20 μm. As a wafer was taken out, it was proved that the piezoelectric material was largely separated. It was thus proved that only a very low bonding strength was obtained.

Comparative Example 2

The plasma activation was performed to produce the bonded body and the CMP processing was performed according to the same procedure as for Inventive Example 1, except that the maximum heating temperature was changed to a low temperature of 150° C. Separation thus occurred when the thickness of the piezoelectric material substrate reached a value lower than about 5 μm. The results are shown in Table 2.

The concentrations of hydrogen, fluorine, nitrogen and carbon at the respective parts of the composite substrates of Inventive Example 1 and Comparative Example 2 were measured by means of SIMS method (secondary ion mass spectroscopy). CAMECA IMS-7f was used as the SIMS measurement system, $Cs^+$ was selected as the primary ion specie and the primary acceleration voltage was 15.0 kV. The detection area was 30 μmφ.

Figure 5:
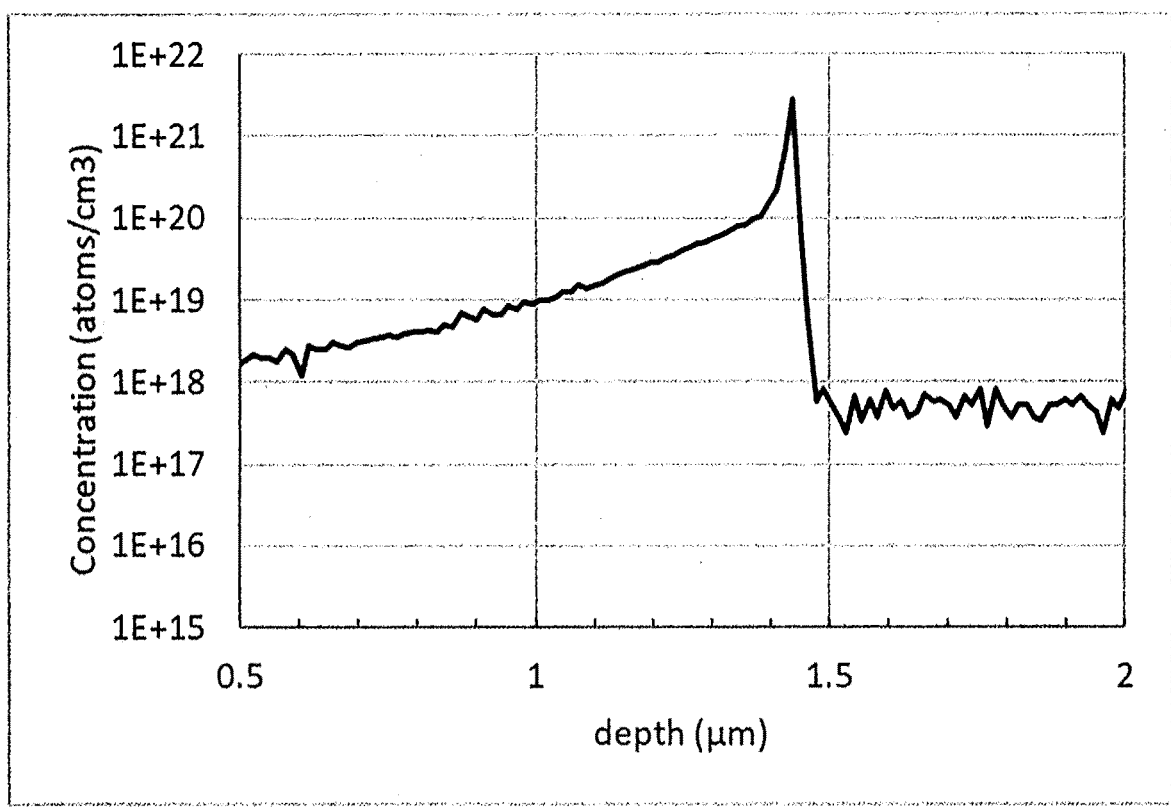
FIG. 5 is a graph showing the concentration of hydrogen atoms in the vicinity of the interface of the composite substrate.

As a result, as shown in FIG. 5, hydrogen atoms were localized along the bonding interface and further diffused into the inside of the piezoelectric material substrate, according to Inventive Example 1. On the other hand, according to Comparative Example 1, hydrogen atoms were not detected.

Figure 6:
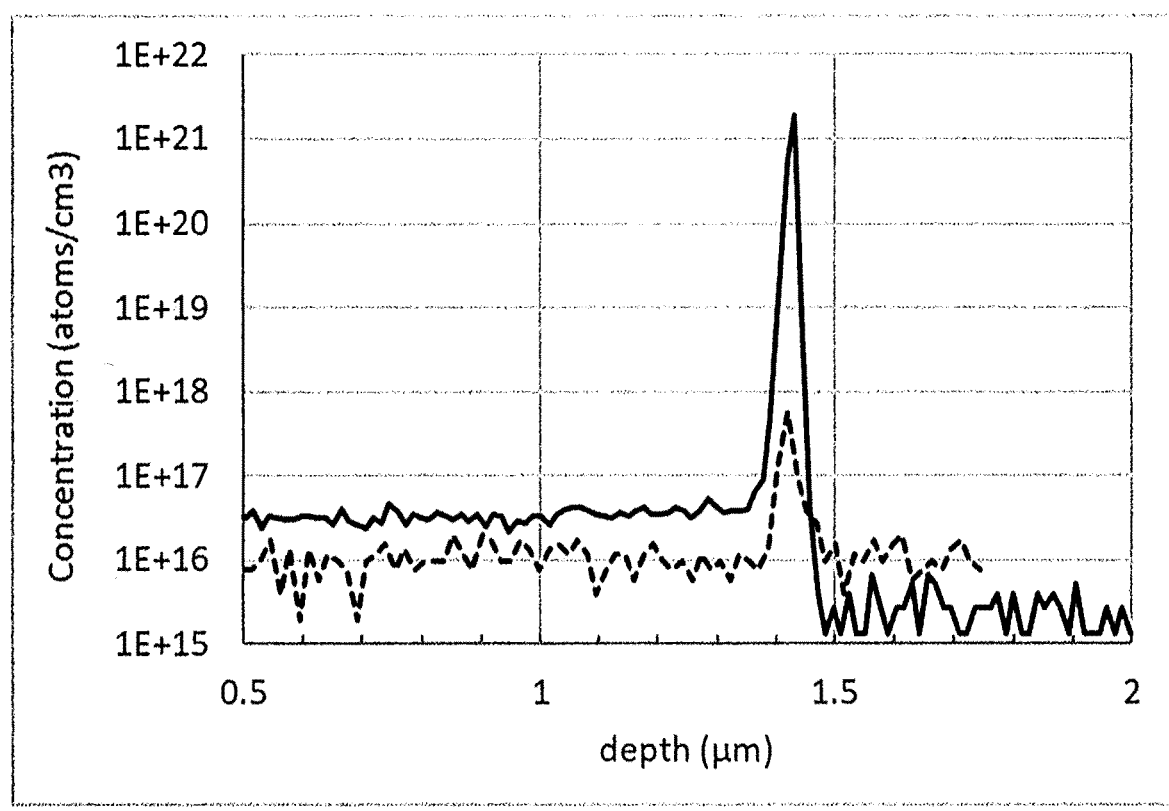
FIG. 6 is a graph showing the concentration of fluorine atoms in the vicinity of the interface of the composite substrate.

Further, as shown in FIG. 6, although fluorine atoms were localized in the vicinity of the bonding interface in both of Inventive Example 1 and Comparative Example 1, the concentration of the fluorine atoms were considerably high in the inventive example.

The source of the generation of the incorporated atoms is considered as follows. That is, the wafer is heated at a high temperature so that Li ions in the piezoelectric substrate are eliminated and hydrogen in the atmosphere is incorporated. Further, fluorine atoms are provided by the degassing from an O-ring in the plasma activation chamber.

Figure 7:
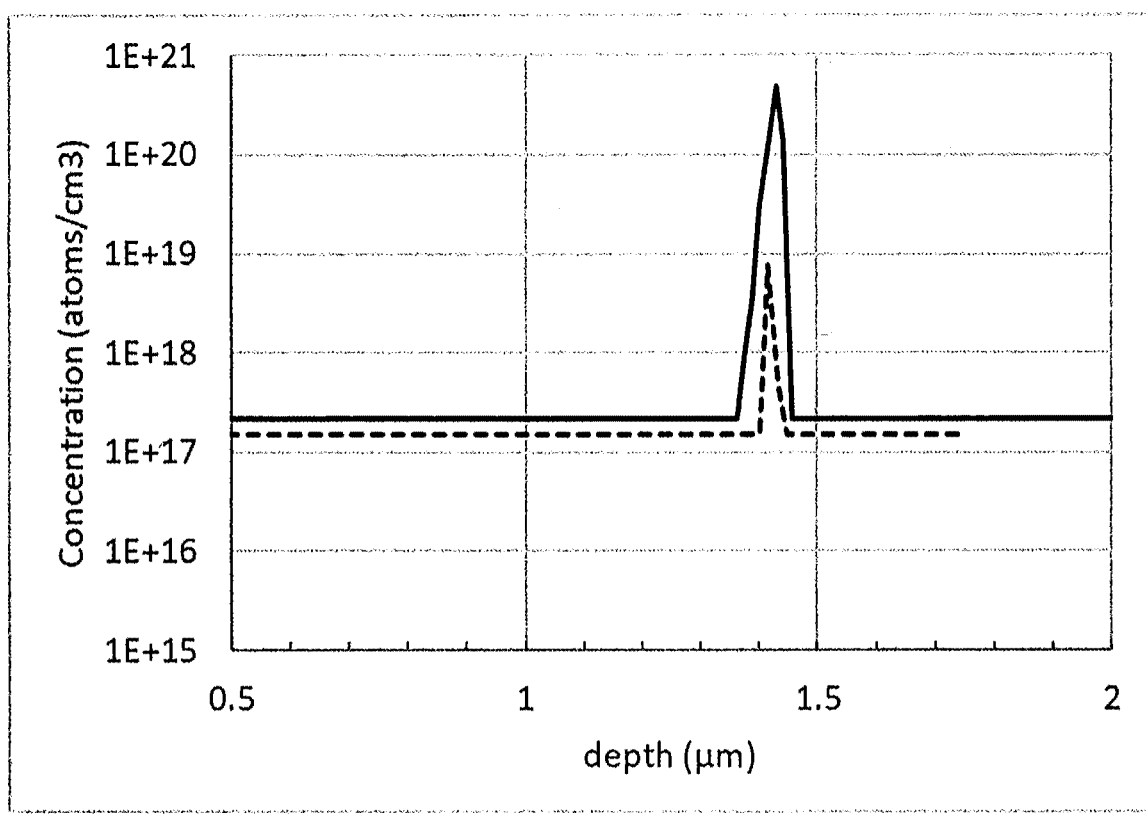
FIG. 7 a graph showing the concentration of nitrogen atoms in the vicinity of the interface of the composite substrate.

Further, as shown in FIG. 7, nitrogen atoms were localized in the vicinity of the bonding interface in both of Inventive Example 1 and Comparative Example 1, and the concentration of nitrogen atoms was considerably higher in the inventive example.

Figure 8:
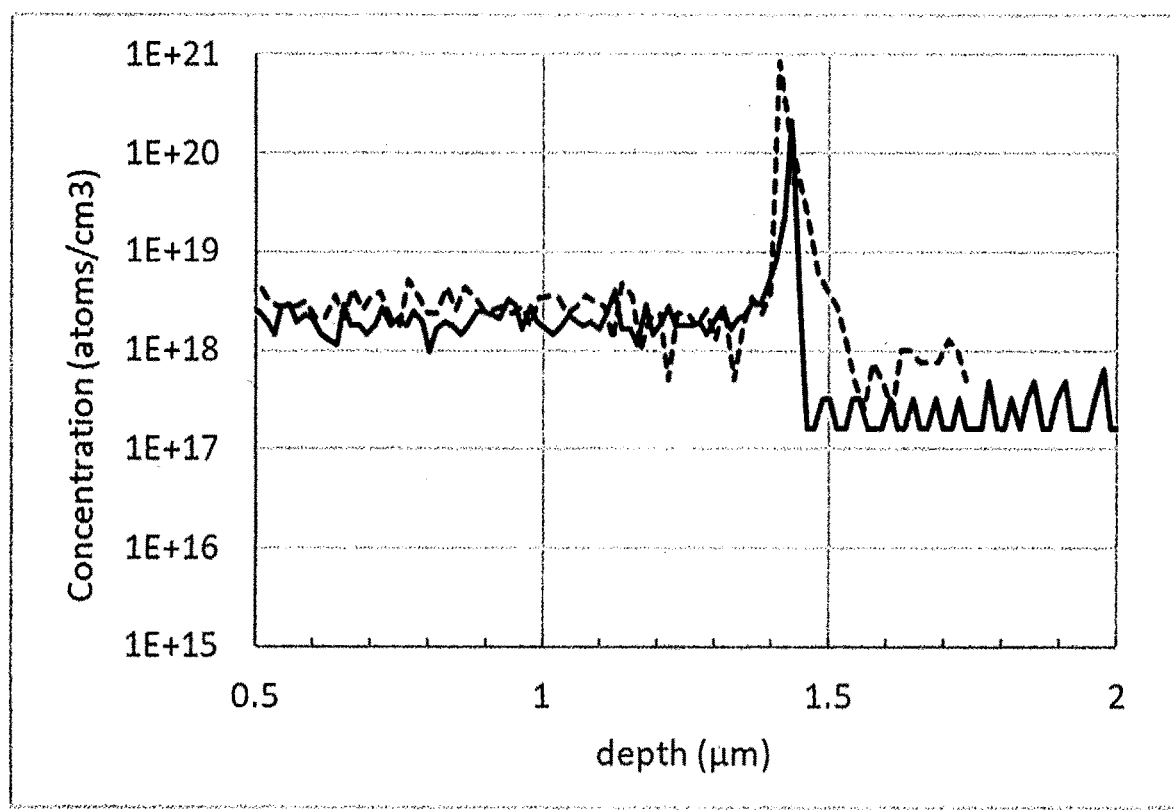
FIG. 8 is a graph showing the concentration of carbon atoms in the vicinity of the interface of the composite substrate.

Further, as shown in FIG. 8, carbon atoms were localized in the vicinity of the bonding interface in both of Inventive Example 1 and Comparative Example 1. A substantial difference between the concentrations of carbon atoms in the interface layer was not found between the inventive example and comparative example.

Figure 9:
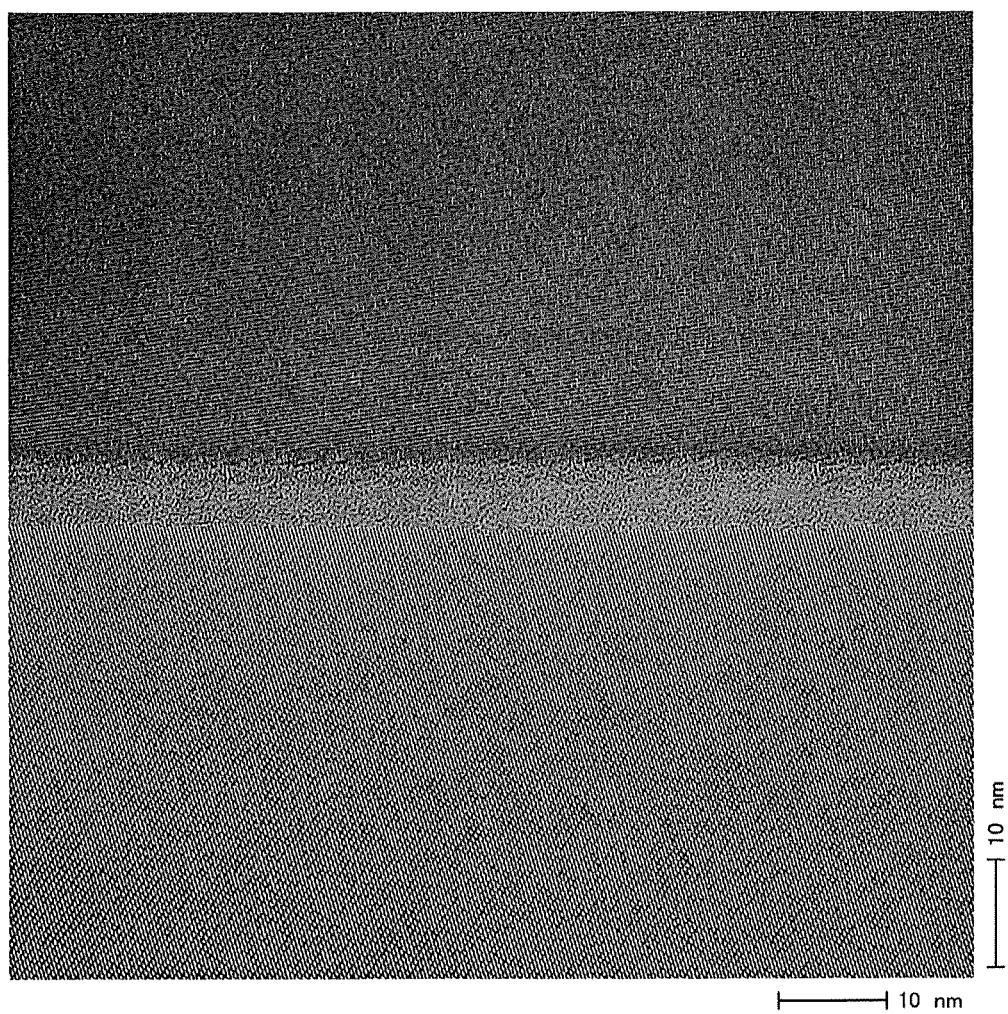
FIG. 9 is a photograph showing the vicinity of the interface of the composite substrate taken by a high-resolution transmission type electron microscope (2,000,000 folds).
Figure 10:
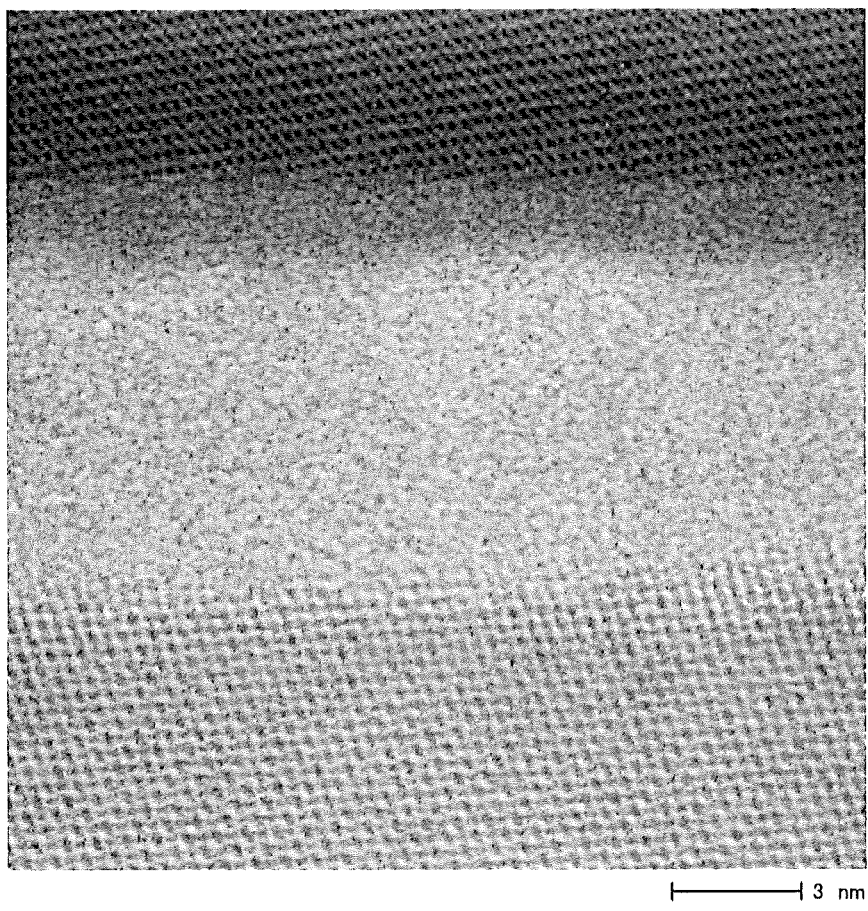
FIG. 10 is a photograph showing the vicinity of the interface of the composite substrate taken by a high-resolution transmission type electron microscope (8,000,000 folds).

FIG. 9 is a photograph showing the vicinity of the interface of the composite substrate of Inventive Example 1 and taken by a high-resolution transmission type electron microscope (at a magnification of 2,000,000 folds), and FIG. 10 is a photograph showing the vicinity of the interface of the composite substrate of Inventive Example 1 and taken by a high-resolution transmission type electron microscope (8,000,000 folds). The lower side of the photograph shows quartz (supporting substrate), the black-contrasted region on the upper side shows lithium tantalate (piezoelectric material substrate) and the bright-contrasted region in the central part of the photograph shows the interface layer. As the horizontal axis (depth) of the data of each graph shown in each of FIGS. 4 to 7 corresponds with the positions in the vertical direction of each of the cross sections, it is possible to correspond the interface layer and the respective concentrations of the atoms.

Inventive Examples 3 and 4 and Comparative Example 3

The surface acoustic wave devices of the respective examples were produced according to the same procedure as that of Inventive Example 1.

However, plasma atmosphere, energy for the surface activation and temperature for the thermal treatment of the bonded body were variously changed so that each concentration of the atoms and thickness of each interface layer of each of the thus obtained composite substrates were changed as shown in Table 1. Then, the bonding strengths of the composite substrates of the respective examples were measured. Further, the piezoelectric material substrates of the composite substrates of the respective examples were processed according to the same procedure as that of Inventive Example 1, and the minimum thickness measured at which the separation did not occur. The results are shown in Tables 1 and 2.

At the same time, the concentrations of hydrogen atoms, nitrogen atoms and fluorine atoms in the respective inventive examples and comparative examples were measured as described above, and the results are shown in Tables 1 and 2.

TABLE 1

|  | Inventive Example 1 | Inventive Example 2 | Inventive Example 3 | Inventive Example 4 |
|---|---|---|---|---|
| Plasma | $N_2$ | $N_2 + O_2$ | $N_2$ | $N_2$ |
| Thermal treatment temperature (° C.) | 250 | 250 | 270 | 350 |
| Concentration of Hydrogen atoms (atoms/cm$^3$) | $2.3 \times 10^{21}$ | $1.4 \times 10^{21}$ | $3.7 \times 10^{21}$ | $4.9 \times 10^{20}$ |
| Concentration of Nitrogen atoms (atoms/cm$^3$) | $3.2 \times 10^{20}$ | $1.9 \times 10^{20}$ | $6.4 \times 10^{20}$ | $5.1 \times 10^{19}$ |
| Concentration of Fluorine atoms (atoms/cm$^3$) | $1.1 \times 10^{21}$ | $8.3 \times 10^{20}$ | $4.4 \times 10^{22}$ | $9.3 \times 10^{19}$ |
| Bonding strength (J/m$^2$) | 2.8 | 3.2 | 3.3 | 2.4 |

TABLE 2

|  | Comparative Example 1 | Comparative Example 2 | Comparative Example 3 |
|---|---|---|---|
| Plasma | Ar | $N_2$ | $N_2$ |
| Temperature for Thermal treatment (° C.) | 100 | 150 | 200 |
| Concentration of Hydrogen atoms (atoms/cm$^3$) | $<5.0 \times 10^{17}$ | $<5.0 \times 10^{17}$ | $8.3 \times 10^{17}$ |
| Concentration of Nitrogen atoms (atoms/cm$^3$) | $<1.0 \times 10^{17}$ | $2.2 \times 10^{17}$ | $8.9 \times 10^{17}$ |
| Concentration of Fluorine atoms (atoms/cm$^3$) | $<1.0 \times 10^{15}$ | $5.4 \times 10^{17}$ | $7.1 \times 10^{17}$ |
| Bonding strength (J/m$^2$) | Not measurable | 0.7 | 1.8 |

"<" means "below detection limit"

As can be seen from the results, according to the present invention, the piezoelectric material substrate and supporting substrate were directly bonded with each other by surface activation method applying plasma containing nitrogen gas and the bonded body after the processing of the piezoelectric material substrate was subjected to thermal treatment at a temperature of 250° C. or higher and 350° C. or lower. It was thereby possible to obtain a high bonding strength.

At the same time, it was confirmed that a still larger bonding strength can be obtained, by adjusting the concentrations of the hydrogen atoms, nitrogen atoms and fluorine atoms in the interface layer in the range defined by the present invention.

The invention claimed is:

1. A composite substrate comprising:
a supporting substrate comprising quartz;
a piezoelectric material substrate comprising a material selected from the group consisting of lithium niobate, lithium tantalate and lithium niobate-lithium tantalate; and an interface layer along a bonding interface between said supporting substrate and said piezoelectric material substrate, said interface layer having amorphous structure and comprising constituent components including silicon, oxygen and at least one of tantalum and niobium, wherein said interface layer has concentrations of hydrogen atoms, nitrogen atoms and fluorine atoms of $1\times10^{18}$ atoms/cm 3 or higher and $5\times10^{21}$ atoms/cm 3 or lower, respectively.

2. The composite substrate of claim 1, wherein said interface layer has said concentrations of hydrogen atoms, nitrogen atoms and fluorine atoms of $1\times10^{19}$ atoms/cm$^3$ or higher, respectively.

3. An acoustic wave device, comprising:
   said composite substrate of claim 1; and
   an electrode on said piezoelectric material substrate.

4. A method of producing a composite substrate comprising a supporting substrate comprising quartz and a piezoelectric material substrate comprising a material selected from the group consisting of lithium niobate, lithium tantalate and lithium niobate-lithium tantalate, said method comprising the steps of:
   irradiating a plasma containing nitrogen gas onto a surface of said supporting substrate to provide a first activated surface;
   irradiating a plasma containing nitrogen gas onto a surface of said piezoelectric material substrate to provide a second surface;
   contacting said first activated surface of said supporting substrate and said second activated surface of said piezoelectric material substrate to obtain a bonded body;
   thinning said piezoelectric material substrate by processing to a thickness of 20 μm or smaller; and
   subjecting said bonded body to a thermal treatment at a temperature of 250° C. or higher and 350° C. or lower.

5. The method of claim 4, wherein said thickness of said piezoelectric material substrate is made smaller by polishing after said thermal treatment.

* * * * *